United States Patent [19]

Lin et al.

[11] 4,054,383
[45] Oct. 18, 1977

[54] JIG AND PROCESS FOR CONTACT PRINTING

[75] Inventors: Burn Jeng Lin, Somers; John Sebastian Mentesana, Poughkeepsie, both of N.Y.; William Godfrey Santy, New Canaan, Conn.; Janusz Stanislaw Wilczynski, Ossining, N.Y.

[73] Assignee: International Business Machines Corporation, Armonk, N.Y.

[21] Appl. No.: 654,428

[22] Filed: Feb. 2, 1976

[51] Int. Cl.² .................................................. G03B 27/20
[52] U.S. Cl. ........................... 355/91; 101/382 MV; 269/21; 269/22; 355/132
[58] Field of Search ............... 8/2.5, 2.5 A; 68/5 C; 38/25–28, 30, 43; 100/93 P, 264; 156/583; 269/21, 22; 101/470, 382 MV; 355/91, 92, 93, 94, 132

[56] References Cited

U.S. PATENT DOCUMENTS

| | | | |
|---|---|---|---|
| 2,239,619 | 4/1941 | Murgatroyd | 101/115 |
| 3,418,926 | 12/1968 | Hakogi | 101/35 |
| 3,420,608 | 1/1969 | Canale | 355/91 |
| 3,533,352 | 10/1970 | Miller | 156/583 |
| 3,591,285 | 7/1971 | Hakogi | 355/91 |
| 3,604,800 | 9/1971 | Jordan et al. | 355/91 |
| 3,644,040 | 8/1972 | Beispel | 355/94 |
| 3,751,163 | 8/1973 | Sutton | 355/92 |
| 3,834,815 | 9/1974 | Greig | 355/91 |
| 3,904,291 | 9/1975 | Webster | 355/91 |
| 3,955,163 | 5/1976 | Novak | 355/91 |

FOREIGN PATENT DOCUMENTS

| | | | |
|---|---|---|---|
| 2,316,401 | 10/1973 | Germany | 355/92 |

OTHER PUBLICATIONS

IBM Technical Disclosure Bulletin; vol. 8, No. 12, May 1966, p. 1786.

*Primary Examiner*—Clyde I. Coughenour
*Attorney, Agent, or Firm*—Pollock, Vande Sande & Priddy

[57] ABSTRACT

A jig for positioning an image mask and image receiving medium which includes a housing having a central bore, first means within the bore for supporting a mask or image receiving medium, a flexible diaphragm, second means for drawing vacuum, and a third means for applying superatmospheric pressure on one side of the diaphragm to deform it towards the first means to ensure proper positioning of the mask and image receiving medium. Also, the process for positioning the mask and image receiving medium is provided.

10 Claims, 12 Drawing Figures

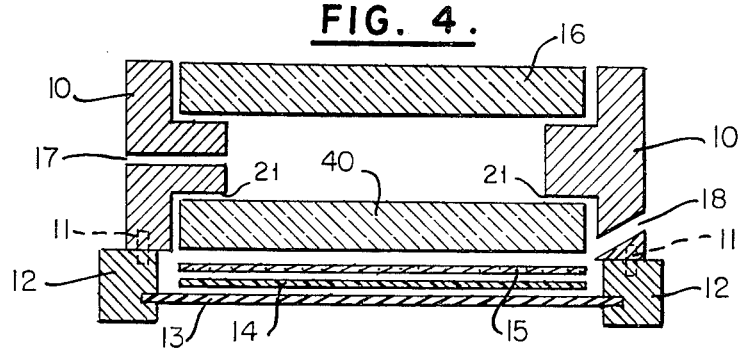
FIG. 4.
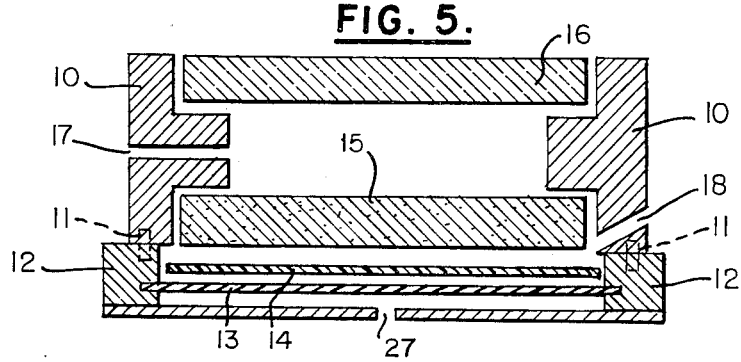
FIG. 5.
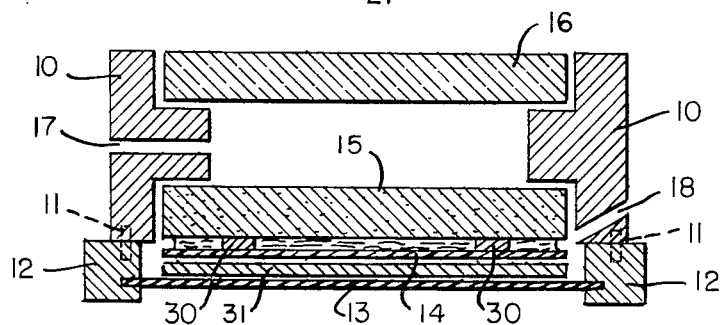
FIG. 6.
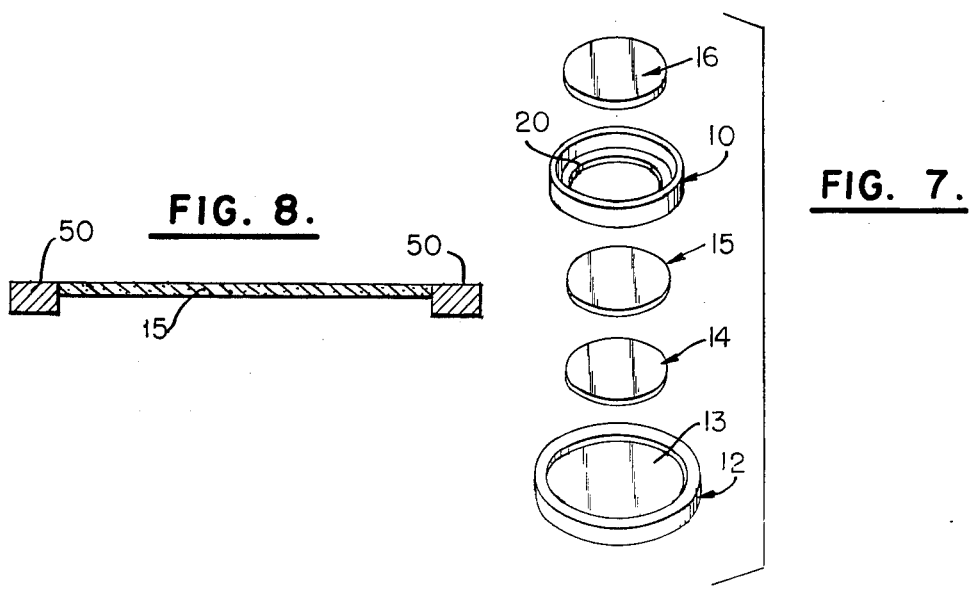
FIG. 7.
FIG. 8.

JIG AND PROCESS FOR CONTACT PRINTING

BACKGROUND OF THE INVENTION

The present invention is related to a jig and process for holding an image mask and image receiving medium in juxtaposed relationship with each other. In particular, the present invention is related to a versatile jig and process which may be employed for both contact and proximity printing wherein a conformable image mask and/or conformable image receiving medium is used.

In the fabrication of devices such as magnetic bubble memory devices, semiconductors, and thin-film optical devices, it has been proposed to employ conventional photolithographic contact printing processes. However, conventional photolithographic contact printing has suffered from a number of disadvantages such as problems of resolution, dimensional control, mask and substrate damage, and photoresist profile control. These problems are particularly acute when the desired product requires fine lines and/or intricate designs.

It has been suggested to employ a photolithographic contact printing with conformable masks to improve the contact between the mask and image receiving medium (wafer) and to thereby overcome some of the problems associated with conventional photolithographic contact printing. Examples of disclosures of conformable contact printing can be found in Smith et al, "Photolithographic Contact Printing, 4000 A Linewidth Patterns", J. Electrochemical Soc. (1974); and Williamson et al, "The Use of Surface-Elastic-Wave Reflection Gradings in Large Time-Bandwidth Pulse-Compression Filters", IEE Tran. Microwave Theory and Techniques, MIT-21, 195–205 (1973). However, prior art methods have not been entirely satisfactory. For instance, some processes are very limited in that they require that the mask be the comformable material.

Accordingly, it is an object of the present invention to provide a jig and process whereby the image receiving medium and/or image mask can be conformable.

In addition, prior art methods have required that the conformable member be larger than the bore of the device to provide the vacuum seal. This results in rigorous control of the thickness of the rigid member and tedious adjustment of its support. Accordingly, it is an object of the present invention to achieve intimate contact quickly. In addition, the large, conformable member results in a waste of materials. Accordingly, it is an object of the present invention to provide a jig and process whereby the image mask and image receiving medium can be the same size and need not be larger than the central bore of the jigs.

A further object of the present invention is to provide a device which can be employed for proximity printing as well as for contact printing.

A further object of the present invention is to provide a device which can be employed for preparing magnetic bubble devices and semiconductor devices and particularly in fabricating high-density single-level bubble memory devices.

SUMMARY OF THE INVENTION

The present invention is directed to a jig for positioning an image mask and an image receiving medium for contact or proximity printing, comprising:

a housing having a central bore;

first means located within the central bore for supporting an image mask or an image receiving medium;

a flexible diaphragm attached to the housing surrounding the periphery of the central bore and juxtaposed to the first means to permit both the image mask and the image receiving medium to be located between the flexible diaphragm and the first means;

second means for drawing a vacuum in the central bore to move at least the image mask or the image receiving medium towards the first means and into position for contact or proximity printing; and third means for applying superatmospheric pressure to one side of the flexible diaphragm to deform the flexible diaphragm towards the first means to ensure proper positioning of the image mask and the image receiving medium.

The present invention is also directed to a jig for positioning an image mask and an image receiving medium for proximity printing, comprising:

a housing having a central bore;

first means located within the central bore for supporting an image mask or an image receiving medium;

a flexible diaphragm attached to the housing surrounding the periphery of the central bore and juxtaposed to the first means to permit both the image mask and the image receiving medium to be located between the flexible diaphragm and the first means;

second means for drawing a vacuum in the central bore between the first means and one side of the flexible diaphragm to remove liquid from the jig after the printing;

third means for applying superatmospheric pressure on the other side of the flexible diaphragm to deform the flexible diaphragm towards the first means to ensure proper positioning of the image mask and the image receiving medium.

The present invention is also related to a process for positioning an image mask and image receiving medium which includes supporting a first image mask or first image receiving medium within the central bore of the housing of a jig; positioning the other of the image mask or image receiving medium between a flexible diaphragm and the first image mask or first image receiving medium; drawing a vacuum in the central bore of the housing to move the image mask and image receiving medium into position for contact or proximity printing; and applying superatmospheric pressure on one side of the diaphragm to deform the flexible diaphragm towards the image mask and image receiving medium to ensure proper positioning of the image mask and image receiving medium.

The present invention is also related to a proximity printing process which includes supporting a first image mask or first image receiving medium within the central bore of the housing of a jig; positioning the other of the image mask or image receiving medium between a flexible diaphragm and the first image mask or first image receiving medium; providing liquid between the image mask and image receiving medium; applying superatmospheric pressure on one side of the diaphragm to deform the flexible diaphragm towards the image mask and image receiving medium to ensure proper positioning of the image mask and image receiving medium; exposing the image mask and image receiving medium to radiant energy; and then drawing a vacuum in the central bore of the housing to remove the liquid from between the image mask and image receiving medium.

BRIEF DESCRIPTION OF THE DRAWINGS

FIG. 4 represents the apparatus of the present invention employing both a conformable mask and conformable wafer.

FIG. 5 represents apparatus of the present invention employing a conformable wafer and conformable mask wherein the wafer is larger than the mask.

FIG. 6 represents the apparatus of the present invention when employed for proximity printing.

FIG. 7 is an exploded view of the apparatus of the present invention as used with a conformable wafer and rigid mask.

FIG. 8 illustrates a thin conformable member supported by an annular frame.

DESCRIPTION OF PREFERRED EMBODIMENTS

Figure 1:
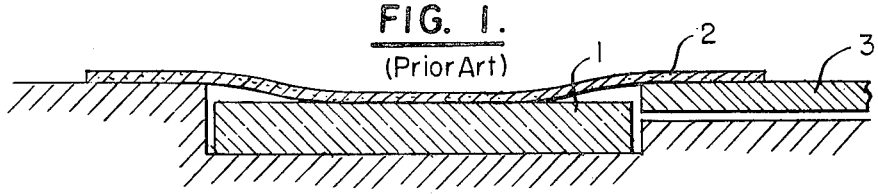
FIG. 1 is a schematic diagram of a prior art device.

FIG. 1 illustrates a prior art device and some disadvantages associated therewith wherein the conformable mask 2 by necessity is larger than the rigid image receiving medium (wafer) 1, thereby resulting in waste of material. Also, since the mask acts as a seal when the vacuum is drawn through conduit 3, it can be damaged.

Figure 2A:
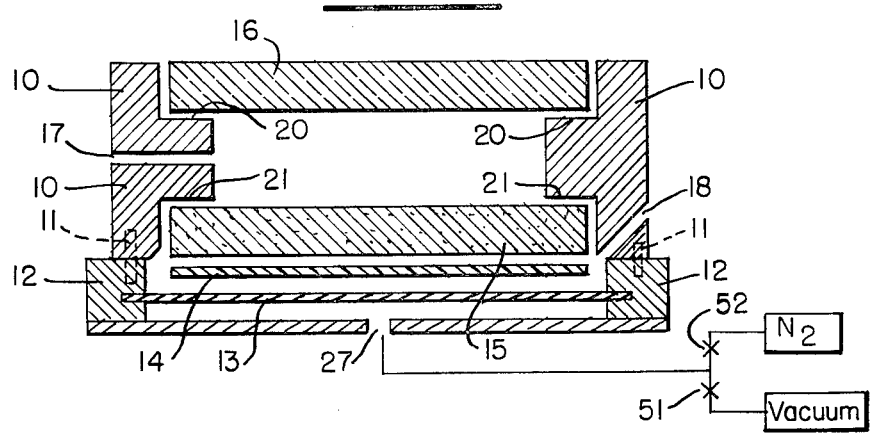
FIG. 2A through FIG. 2C illustrate the position of the various elements during use of the apparatus of the present invention for a conformable wafer and rigid mask.
Figure 2B:
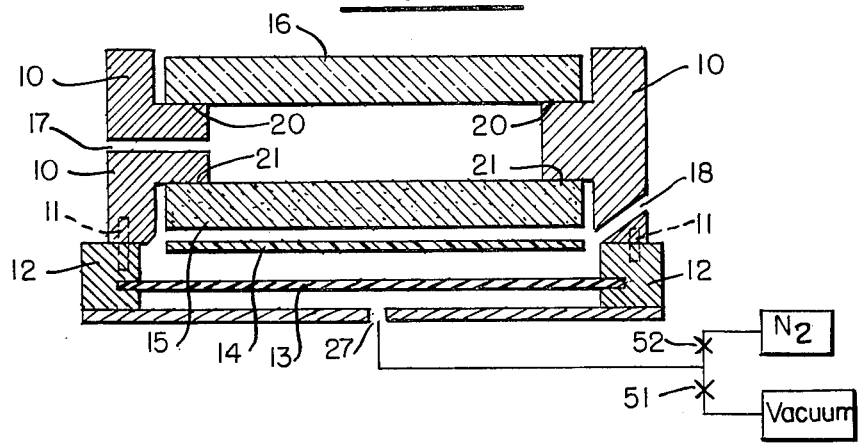
Figure 2C:
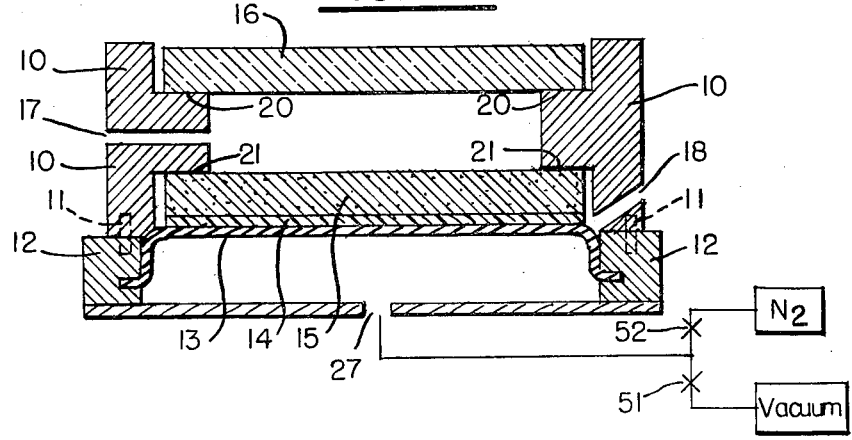

FIGS. 2A to 2C represent various stages of the jig when in use in a conformable contact printing process, whereby the mask is rigid and the image receiving medium is conformable. In FIG. 2A to 2C, a housing 10 defines the structural walls of the jig.

The walls of the device are made of any suitable structural material such as stainless steel. In addition, the jig is most conveniently of annular configuration as shown in FIG. 7. In the central bore of the jig are ledges 20 to provide means to support the window 16 in its proper position. Window 16 makes the central bore of the jig accessible to radiant energy such as ultraviolet light from an exterior source (not shown) for exposing the image mask 15 and image receiving medium 14 as required in contact and proximity printing. The clearance between the interior wall of the jig and the window 16 is about 1/16th of an inch. The window 16 is constructed of any suitable transparent material such as glass, quartz, and sapphire.

The opposite end of the jig is closed by an annular cover 12 to which is attached the conformable diaphragm 13. The conformable diaphragm 13 is flexible enough so that when it is subjected to a suitable pressure differential, it will exert pressure on the image receiving medium and mask in order to urge the two together. The diaphragm is usually of a thickness between about 0.001 inch to about 0.020 inch, but must not be so thin that when the pressure differential is applied, it will bubble out. The preferred materials, employed are pliable and flexible synthetic rubbers such as neoprene rubber and films obtained from latex rubber compositions. However, other flexible materials such as thin metal films, synthetic plastics such as polyesters (mylar), polyvinyl chloride, and polyvinylidene chloride can be employed when desired.

A fastening means 11 secures the circular annular cover 12 which holds the flexible diaphragm 13 to the other portion of the jig walls. A rigid mask 15 is seated on a seat portion 21 below seat portion 20 and above the conformable image receiving medium 14. Between window 16 and mask 15, a conduit 17 leads from the central bore of the jig to a vacuum source (not shown) to provide a vacuum means. A conduit 18 leads to the space between diaphragm 13 and mask 15 from a vacuum source (not shown) to provide another vacuum means. Conduit 18 is angled for convenience.

Rigid mask 15 can be any mask material employed in conventional photolithographic processes. The clearance between the interior walls of the jig and the mask is about 1/16th of an inch. In assembling the device for use, the mask is first placed in the jig and held to the assembly by application of the vacuum means through conduit 17 which pulls both the mask and window into place as illustrated in FIG. 2B. Next, the image receiving medium, which includes a photosensitive coating on the wafer, is placed on top of the annular cover and diaphragm assembly which is then attached to the rest of the jig by means of fasteners 11 (e.g., screws).

Next, another vacuum means is applied through conduit 18 thereby causing the flexible diaphragm 13 to move upwards to seal the clearance between the vacuum conduit 18 and the interior of the device as illustrated in FIG. 2C to maintain the vacuum conditions. The conformable diaphragm 13 in turn exerts pressure on the wafer 14 and urges it towards masking medium 15. In addition, as shown, positive superatmospheric pressure such as that from pressurized nitrogen of about 2 atmospheres is applied to the underside of the conformable diaphragm to provide intimate contact between the proper positioning of the image receiving medium and the image mask. The ability to provide this positive pressure provides much better and intimate contact than can be achieved without it and improves the uniformity of the contact throughout the area of the mask and wafer.

The superatmospheric pressure is usually at least about 1.5 atmospheres. The pressure employed should not be so great that it causes damage to the conformable members. Usually up to about 5 atmospheres pressure is suitable. The superatmospheric pressure is applied through conduit 27 from pressure source to further urge the image receiving medium towards the mask as illustrated in FIG. 2C.

Since the vacuum seal is provided by the diaphragm rather than the mask or wafer, the diameters of the mask and wafer can be made smaller than the central bore of the jig. Accordingly, valuable material is saved by eliminating the need to make the mask or wafer bigger than the central bore of the jig. Moreover, the mask or wafer can be thinner as compared to when a mask or wafer must provide the vacuum seal. Of course, if desired, the mask or wafer can be made larger.

Conformable wafer 14 should be no thicker than about 0.025 inch and should bend at least about $5 \times 10^{-4}$ cm when subjected to a pressure differential about 2 atmospheres and supported at its periphery. The conformable wafer should be at least about 0.0005 inch thick. The material employed can be any of the materials employed for image receiving mediums used in contact and proximity printing.

When desired, a vacuum may be applied through conduit 27 from vacuum source by opening valve 51 and closing valve 52, to facilitate removal of the image receiving medimum from the jig and to reduce danger of damage due to mishandling.

Figure 3A:
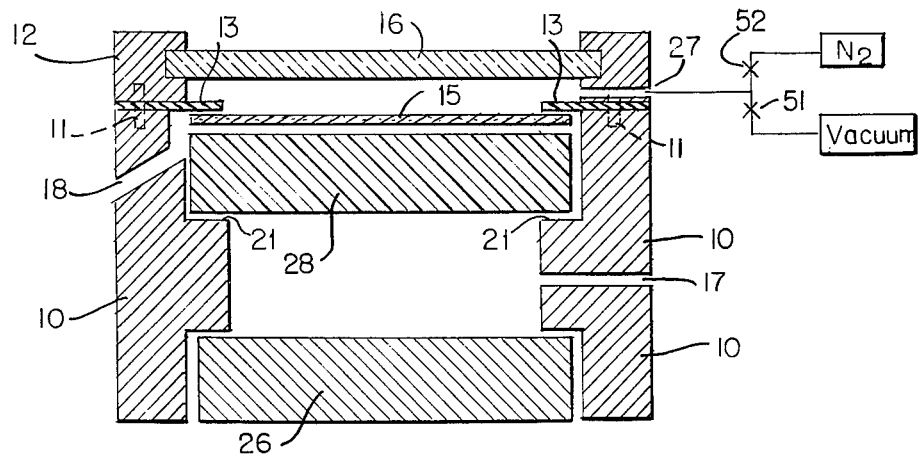
FIG. 3A through FIG. 3C illustrate the position of the various elements during use of the apparatus of the present invention for a conformable mask and rigid wafer.
Figure 3B:
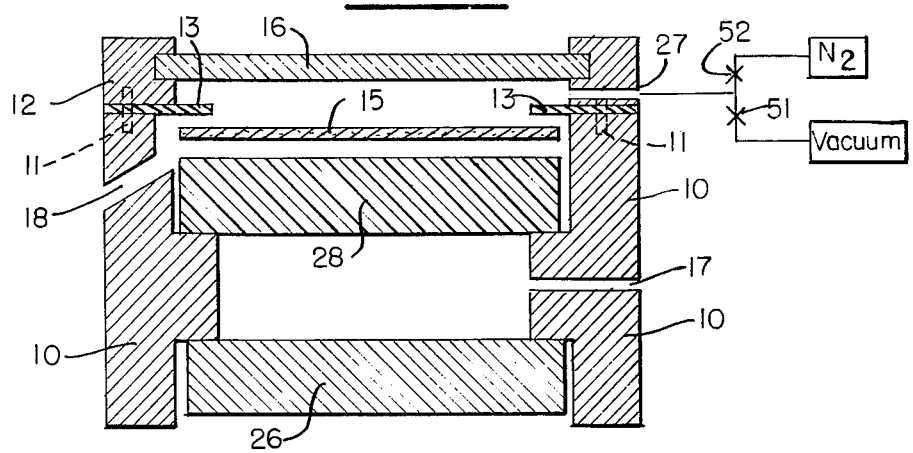
Figure 3C:
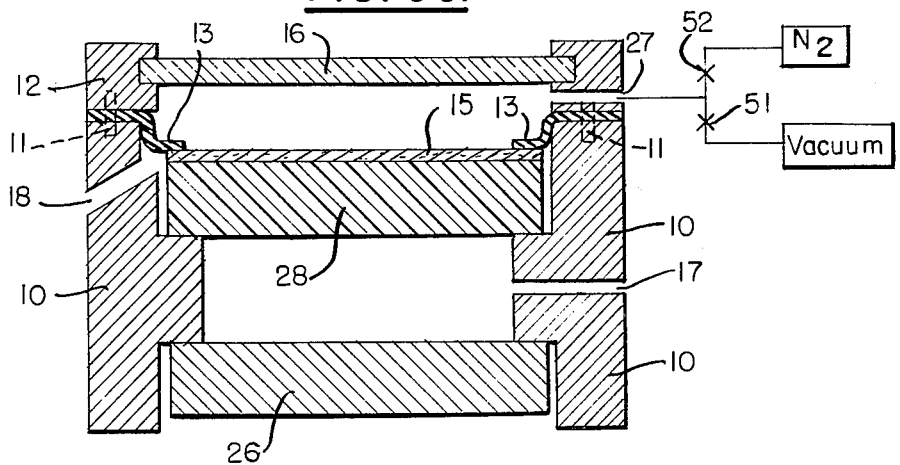

FIGS. 3A through 3C represent one way in which the jig can be employed to provide contact printing with a conformable mask. The versatility of the jig of the present invention is illustrated by its useability with a conformable mask and/or conformable image receiving medium.

The apparatus in FIG. 3 is similar to that shown in FIG. 2 except that the apparatus is inverted with the image receiving medium taking the position of the mask and the mask taking the position of the image receiving medium. In addition, since a full diaphragm would block the illumination needed for exposure, a ring or annular diaphragm is provided on top of the conformable mask. The apparatus in FIG. 3 is shown in this "inverted" position for convenience in providing the necessary radiant energy for exposure. However, it is recognized that the apparatus of FIG. 2 need not be inverted since the radiant energy could be directed from a source to the underside of the jig rather than overhead as is the case in operating the jig of FIGS. 2 and 3.

In FIGS. 3A through 3C, cover 26 for the central bore permits application of a vacuum beneath image receiving medium 28 to hold it in place. However, the vacuum supplied through vacuum conduit 17 is not essential in operation of the jig according to this aspect of the invention since the image receiving medium can be maintained in position by merely resting upon the ledges 21 of the jig. However, it is still preferred to apply the vacuum means through conduit 17 to facilitate registering accurately the mask and image receiving medium.

The jig is operated by applying vacuum through the conduit 18 which causes the diaphragm to move downwards to seal the opening between the conduit 18, between the diaphragm itself and the chamber above the conformable mask and to exert pressure on the conformable mask to thereby urge the mask and image receiving medium together. In addition, superatmospheric pressure is applied through conduit 27 from pressure source to further urge the mask towards the image receiving medium as illustrated in FIG. 3C. After the mask and wafer have been exposed to the radiant energy through the window for the desired amount of time, the vacuum from conduit 18 and from conduit 17, if applied, and the pressure are removed or released.

In order to facilitate removal of the conformable mask from the device and to reduce the danger of damage due to mishandling, a vacuum is applied through the conduit 27 from vacuum source, by opening valve 51 and closing valve 52. This vacuum urges the mask upwards with the diaphragm assembly which when disconnected from the rest of the assembly can be removed from the remainder of the assembly thereby reducing the danger of damage to the conformable mask.

The chamber above the diaphragm in the jig of FIG. 3 provides a means for varying the pressure on the top side of the flexible annular diaphragm from superatmospheric levels at which the diaphragm is deformed to ensure proper positioning of the image mask and image receiving medium to subatmospheric levels at which the flexible diaphragm is deformed in a direction to facilitate separation of the image mask and image receiving medium.

The diaphragm in the jig of FIG. 3 is a ring or annular diaphragm with an opening for the radiant energy to pass through for exposure of the mask and wafer. The annular diaphragm overlaps the conformable mask to a degree sufficient that a portion of the diaphragm is in contact with the top of the mask to exert downward pressure upon the mask. A typical diaphragm overlaps the mask by about 1/16 inch. Of course, this overlap size can be scaled up or down. In order that the mask be considered conformable, it should bend at least about $5 \times 10^{-4}$ cm when subjected to a pressure differential of two atmospheres pressure and supported at its periphery. Also, the thickness of the mask should be no thicker than about 0.025 inch and preferably is no less than about 0.0005 inch in thickness. However, in certain instances, the mask can be somewhat thinner whereby it must be supported at its ends by a flexible frame 50 as shown in FIG. 8.

FIG. 4 illustrates the apparatus which can be used wherein both the mask and wafer are conformable and is operated in the same manner as the apparatus in FIG. 2. It is noted that the conformable mask in this case is backed by a second transparent window 40 to prevent damage of the mask and to render the apparatus suitable for this type of operation. If the conformable image receiving medium employed in the jig of FIG. 4 is thinner than about 0.0005 inch, it must be supported at its ends by a flexible frame along the lines shown for the conformable mask in FIG. 8. In this case, the flexible diaphragm should have holes in it whereby the gas pressure itself would press against the image receiving medium rather than the diaphragm pressing against it to prevent possible damage to the image.

FIG. 5 illustrates the use of a large wafer in the apparatus.

FIG. 6 illustrates the manner in which the jig can be used in proximity printing. Proximity printing is employed in place of contact printing in those situations when it is desired to reduce the wear and tear of the mask. In proximity printing, there is space as represented by spacers 30 between the image receiving medium 14 and mask 15. In addition, a rigid movable disc 31 is maintained between the diaphragm 13 and image receiving medium 14 to help maintain a uniform gap between the image receiving medium 14 and mask 15 by supporting the conformable image receiving medium 14. Without the rigid movable disc 31, the conformable image receiving medium 14 could deform up into the open areas between the spacers thereby causing uncontrollable results in the printing.

In addition, in proximity printing, it is preferred, but not essential, to employ a liquid within the gap between the mask and wafer to improve the image and reduce the defraction effect. When the liquid is present in the gap, the jig is operated similarly to that in FIG. 2 except that the vacuum means from conduit 18 is not activated before or during the printing. The contact between the mask, spacer, and wafer is achieved by applying the superatmospheric pressure. After the image receiving medium and image mask are exposed to the radiant energy, and pressure means is deactivated, the liquid is then removed by drawing the vacuum through conduit 18. This in turn facilitates the separation of the mask and wafer. The operation of the jig as discussed above enables the liquid to be maintained for long periods of time in the jig when needed. It is also possible to carry out the proximity printing without the spacers and blank and only employing the liquid.

The liquid should have relatively high refractive index, and relatively low optical absorption and be easily removed from the jig. The refractive index is usually at least about 1.3 and the absorption coefficient is generally no greater than about 0.1 per micron. Examples of suitable liquids include water, ethyl alcohol, and isopropyl alcohol. Also, when a positive photoresist is employed in the printing process, the liquid can be the developer for the photoresist such as methyl isobutyl ketone for polymethylmethacrylate and xylene or developers available under the trade designation "AZ developer" for AZ-type photoresists from Shipley Company, Inc. AZ developer is an aqueous alkaline solution of pH of about 12.7 and is believed to contain $Na_2SiO_3$, $Na_2PO_3$, and NaOH.

It is recognized that the particular materials to employ for the mask, diaphragm, and image receiving medium for operation of all of the jigs discussed hereinabove can be readily selected by persons in the art once they are aware of the present application. Moreover, in proximity printing employing a liquid, the mask and image receiving medium must be inert to the liquid employed.

It is further noted that in operating all modes of the present invention, the superatmospheric pressure is applied from or through the diaphragm to the conformable or thinner of the mask or image receiving medium. This prevents damage to the conformable material which could readily occur by applying the pressure to the rigid or thicker element which in turn would press against the more fragile conformable material. During contact printing, it is desirable to achieve as complete a vacuum as possible between the mask and image receiving medium. The different vacuum means described hereinabove are operated independently of each other.

Although the above illustrations of employing the jig of the present invention are directed to printing processes wherein the radiant energy is directed from a source (not shown) to the topside of the jig, it is understood that the radiant energy could be directed from a source to the underside of the jig. In such instances, the image mask and image receiving medium would have to change positions with each other since the mask must always be between the radiant energy and the image receiving medium.

What is claimed is:

1. A jig for positioning an image mask and an image receiving medium for contact or proximity printing, comprising:
    a housing having a central bore;
    first means located within said central bore for supporting an image mask or an image receiving medium;
    a flexible diaphragm attached to said housing surrounding the periphery of said central bore and juxtaposed to said first means to permit both said image mask and said image receiving medium to be located between said flexible diaphragm and said first means;
    second means for drawing a vacuum in said central bore on one side of said flexible diaphragm to move said image mask or said image receiving medium toward said first means and into position for contact or proximity printing; and
    third means for applying superatmospheric pressure to the other side of said flexible diaphragm to urge said flexible diaphragm toward said first means to ensure intimate contact of said image mask and said image receiving medium, and
    wherein said flexible diaphragm extends into said central bore a limited extent sufficient for forming a vacuum seal when drawing a vacuum in said central bore, and being positioned short of the center of the bore for permitting radiant energy exposure of said image mask and said image receiving medium.

2. A jig according to claim 1 wherein said flexible diaphragm is an annular diaphragm to permit radiant energy to pass therethrough for exposing said image mask and image receiving medium.

3. A jig according to claim 1 wherein said third means provides for varying the pressure on one side of said flexible diaphragm from superatmospheric levels at which said flexible diaphragm is deformed toward said first means to ensure proper positioning of said image mask and said image receiving medium to subatmospheric levels at which said flexible diaphragm is defomed away from said first means to facilitate separation of said image mask and said image receiving medium.

4. A jig according to claim 3 wherein said third means comprises an enclosed volume located on said one side of said flexible diaphragm, a source of pressurized gas communicating with said enclosure and a vacuum pump communicating with said volume.

5. A jig according to claim 1 wherein said second means comprises a vacuum pump and a conduit entering said central bore at a location to be closed by said flexible diaphragm as it deforms toward said first means.

6. A jig according to claim 1 which further includes another means operated independently of said second means for holding the mask or image receiving medium in position for printing.

7. A jig according to claim 1 wherein said second means is between said first means and one side of said flexible diaphragm and whereby said diaphragm deforms to move said mask or said medium toward said first means.

8. A contact or proximity printing process which includes supporting a first image mask or first image receiving medium within the central bore of housing of a jig;
    positioning the other of the image mask or image receiving medium between a flexible diaphragm and the first image mask or first image receiving medium;
    drawing a vacuum in the central bore of the housing on one side of said flexible diaphragm to move the image mask and image receiving medium into position for contact or proximity printing;
    said flexible diaphragm extending into the central bore to a limited degree sufficient so that it acts as a seal for said vacuum;
    applying superatmospheric pressure on the other side of the diaphragm to urge the flexible diaphragm towards the image mask and image receiving medium to ensure intimate contact of the image mask and image receiving medium; and
    exposing the image mask and image receiving medium to radiant energy, whereby said flexible diaphragm is positioned short of the center of the bore to permit the exposing of said image mask and image receiving medium.

9. A process according to claim 8 wherein after the printing a vacuum is drawn on said other side of said flexible diaphragm to deform the diaphragm in a direction to facilitate separation of the image mask and image receiving medium.

10. A process according to claim 8 which further includes applying a second vacuum means to hold said first mask or said first image receiving medium in position for printing.

* * * * *

UNITED STATES PATENT AND TRADEMARK OFFICE
CERTIFICATE OF CORRECTION

PATENT NO. : 4,054,383
DATED : October 18, 1977
INVENTOR(S) : Burn Jeng Lin et al It is certified that error appears in the above-identified patent and that said Letters Patent are hereby corrected as shown below:

Column 4, penultimate line, change "medimum" to
-- medium --.

Signed and Sealed this

Seventeenth Day of October 1978

[SEAL]

Attest:

RUTH C. MASON
Attesting Officer

DONALD W. BANNER
Commissioner of Patents and Trademarks